United States Patent [19]

Yang et al.

[11] Patent Number: 5,065,203

[45] Date of Patent: * Nov. 12, 1991

[54] TRENCH STRUCTURED CHARGE-COUPLED DEVICE

[75] Inventors: Kei-Wean C. Yang; John E. Taggart, both of Beaverton, Oreg.

[73] Assignee: Tektronix, Inc., Beaverton, Oreg.

[*] Notice: The portion of the term of this patent subsequent to Feb. 12, 1991 has been disclaimed.

[21] Appl. No.: 561,498

[22] Filed: Jul. 30, 1990

Related U.S. Application Data

[63] Continuation of Ser. No. 368,743, Jun. 19, 1989, abandoned, which is a continuation-in-part of Ser. No. 216,079, Jul. 7, 1988, Pat. No. 4,992,842.

[51] Int. Cl.$^5$ .................... H01L 29/78; G11C 19/28
[52] U.S. Cl. ......................................... 357/24; 377/58
[58] Field of Search ................ 357/24; 377/57-63

[56] References Cited

U.S. PATENT DOCUMENTS

| | | | |
|---|---|---|---|
| 3,760,202 | 9/1973 | Kosonocky | 307/304 |
| 3,767,983 | 10/1973 | Berglund | 317/235 |
| 3,796,932 | 3/1974 | Amelio et al. | 317/235 |
| 3,852,799 | 12/1974 | Walden | 357/24 |
| 3,986,198 | 10/1976 | Kosonocky | 357/24 |
| 4,067,001 | 1/1978 | Hoffman | 365/174 |
| 4,245,233 | 1/1981 | Lohstrom | 307/311 |
| 4,358,890 | 11/1982 | Heller et al. | 357/24 |
| 4,364,164 | 12/1982 | Bluzer et al. | 29/571 |

OTHER PUBLICATIONS

Seguin et al., *Charge Transfer Devices*, Academic Press, N.Y., 1975, pp. 80-85.

*Primary Examiner*—Gene M. Munson
*Attorney, Agent, or Firm*—John Smith-Hill; John P. Dellett

[57] ABSTRACT

The charge transfer efficiency of a two-phase charge-coupled device cell is enhanced by providing a three-tiered built-in potential in the channel of each cell. Two lower potential tiers form a trenched potential well in the cell for storing charge. A higher potential tier between the trenched potential well of a cell and the potential well of a preceding neighbor cell provides a potential barrier preventing backflow of charge from well-to-well. The potential trench is located at the downstream end of the well adjacent a succeeding neighbor cell of the CCD.

4 Claims, 4 Drawing Sheets

TRENCH STRUCTURED CHARGE-COUPLED DEVICE

CROSS-REFERENCES TO RELATED APPLICATION

This is a continuation of Ser. No. 07/368,743 filed June 19, 1989 and now abandoned, which is a continuation-in-part of our co-pending U.S. patent application Ser. No. 07/216,079 entitled "Tilted Channel, Charge-Coupled Device", filed July 7, 1988, U.S. Pat. No. 4,992,842.

BACKGROUND OF THE INVENTION

The present invention relates to charge-coupled devices and in particular to a charge-coupled device cell employing a channel potential trench to improve charge transfer efficiency.

A charge-coupled device (CCD) includes an array of closely spaced cells aligned along a lateral path. Each cell includes an electrode formed on an oxide layer covering a semiconductor substrate having a channel region for storing charge carriers. When clock signals of differing phase drive electrodes of neighboring cells, an electrical field develops between channel regions of neighboring cells, and this electrical field drives charge carriers stored in the channel region of one cell into the channel region of its neighboring cell. With appropriately phased clock signals applied to electrodes of neighboring CCD cells, charges shift laterally from cell-to-cell.

During initial stages of charge transfer between adjacent CCD cells, the clock-induced potential gradient between the channel regions of the cells provides a strong electrical field driving carriers quickly into the receiving cell. A high carrier concentration gradient between channel regions of the adjacent cells also encourages carrier flow by diffusion. However, the carrier concentration gradient at the edge of the transferring cell decreases as fewer and fewer carriers are left. Meanwhile, the Fermi level under the transferring cell also decreases with decreasing carrier density. This leads to reduced potential gradient across the junction between the cells, thereby reducing carrier flow rate at the junction.

The "charge transfer efficiency" of a charge-coupled device is the ratio of charge transferred out of a cell by the end of a charge transfer cycle to the initial charge stored in the cell at the beginning of the transfer cycle. A high charge transfer efficiency prevents substantial degradation of charge passing through the charge-coupled device. As the frequency of clock signals applied to the electrodes of CCD cells increases, the time available for all charge carriers to move from one cell to its neighboring cell decreases. At high clock frequencies, a substantial portion of the charge may remain behind at the end of a transfer cycle. Thus as the frequency of operation of a charge-coupled device increases, charge transfer efficiency decreases.

A conventional two-phase CCD cell, as described, for example, in U.S. Pat. No. 3,986,198 entitled "Introducing Signal at Low Noise Level to Charge-Coupled Circuit" issued Oct. 12, 1976 to Kosonocky, varies dopant concentration in the channel to provide a two-tiered built-in channel potential. A lower potential tier forms a potential well in the cell for storing charge. A higher potential tier between the potential well of the cell and a potential well of its preceding neighbor cell acts as a potential barrier to prevent backflow of charge from well-to-well.

During initial stages of charge transfer, carriers in the well of one cell are at a substantially higher potential than the potential barrier of the next succeeding cell, and the carriers rapidly drift and diffuse over the barrier into the well of the next cell. However, during later stages of charge transfer when only a few charge carriers remain in the potential well of the cell, the electrical field and the concentration gradient at the cell junction grow small and the remaining few carriers move through the well and into the next cell primarily limited by a diffusion process at a relatively slow rate that is a function of the length of the well.

In U.S. Pat. No. 3,796,932 entitled "Charge Coupled Devices Employing Nonuniform Concentrations of Immobile Charge along the Information Channel", issued Mar. 12, 1974 to Amelio et al, the channel region in each CCD cell has a tilted built-in potential gradient in the lateral direction. The tilted potential gradient provides an electrical field on charge carriers within the channel region to increase the rate of charge carrier drift through the channel region. The drift rate increase is most apparent during the later portion of a clock signal phase when carrier concentration and clock-induced potential gradients at the junction between neighboring cells are small.

While a tilted channel potential gradient improves charge transfer efficiency at higher clock frequencies, a tilted channel CCD cell is more expensive to manufacture than the two-tier cell, and charge transfer rate is substantially improved only at relatively low charge levels.

SUMMARY OF THE INVENTION

In accordance with an aspect of the invention, a three-tiered, channel potential profile along the transferring channel of each cell enhances the charge transfer efficiency of a two-phase charge-coupled device (CCD) cell. Two lower potential tiers form a trenched potential well in the cell for storing charge. A higher potential tier between the trenched potential well of a cell and the potential well of its preceding neighbor cell acts as a potential barrier preventing backflow of charge from well-to-well. The potential trench resides at the downstream end of the well adjacent the next succeeding cell of the CCD in the direction of carrier flow.

During all stages of a charge transfer cycle, the carrier concentration at the junction between neighboring cells and the carrier concentration gradient across the junction are higher for the trench structured cell CCD than for an untrenched cell CCD of the prior art. The higher carrier concentration and concentration gradient at the junction improve carrier flow rate across the junction.

During later stages of charge transfer, carriers remaining in a cell congregate in the trench near the neighboring cell, thereby increasing the carrier concentration at the junction and reducing the effective gate length. When trenched and untrenched cells have the same charge storage capacity, the same channel length, and the same barrier length, the trench structured cell has a shorter effective channel length near the end of a charge transfer cycle. Since the trenched cell begins its final diffusion limited stage of charge transfer earlier than the untrenched cell and since the distance carriers must diffuse is shorter, the time required for the remaining carriers to diffuse out of the trench is substantially less than the time required for such carriers to diffuse out of an untrenched well. Therefore, the trench at the downstream end of the potential well improves the charge transfer efficiency of a CCD cell operated at a high clock rate.

It is accordingly an object of the invention to provide an improved charge-coupled device having high charge transfer efficiency when operating at a high clock frequency.

The subject matter of the present invention is particularly pointed out and distinctly claimed in the concluding portion of this specification. However, both the organization and method of operation of the invention, together with further advantages and objects thereof, may best be understood by reference to the following description taken with the accompanying drawings wherein like reference characters refer to like elements.

DESCRIPTION OF THE PREFERRED EMBODIMENTS

Figure 1:
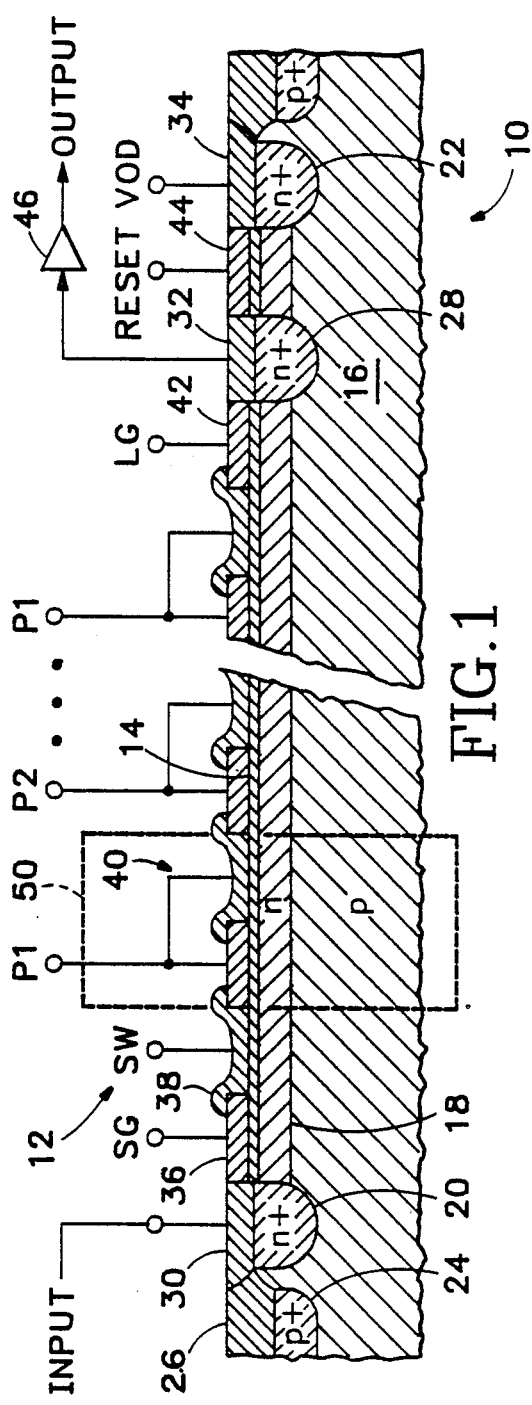
FIG. 1 is a sectional view of the global structure of a two-phase charge-coupled device.

Referring to FIG. 1, a two-phase, charge-coupled device (CCD) 10 comprises an array 12 of closely spaced polysilicon electrodes aligned along a lateral path on a silicon dioxide insulation layer 14 grown on the surface of an intrinsic p-type silicon semiconductor substrate 16. (FIG. 1 is exaggerated in vertical dimension for better illustration of structural detail.) Extensions of insulation layer 14 isolate electrodes of array 12 from one another. Dopant ions in a portion of substrate 16 under array 12 form an n-type channel region 18 between n+ input and output diffusion regions 20 and 22. Channel region 18 preferably provides a buried channel for conducting charge carriers in a lateral direction under the electrode array 12. However, in alternative embodiments of the invention, channel region 18 may provide a surface channel depending on how the channel is formed. A p+ guard ring diffusion region 24 covered by a field oxidation layer 26 surrounds charge-coupled device 10. An n+ floating diffusion region 28 intersects channel region 18 near the output diffusion region 22. Metallic contacts 30, 32 and 34 extend through insulation layer 14 to provide connections to diffusion regions 20, 22 and 28, respectively. The electrodes of array 12 include a "sample gate" electrode 36, a "sample well" electrode 38, a sequence of CCD cell electrode pairs 40, and a "last gate" electrode 42. An additional "reset" electrode 44 lies above the portion of channel region 18 between diffusion regions 22 and 28.

Each CCD cell electrode pair 40, along with the portion of insulation layer 14 and substrate 16 therebelow, comprises a separate cell 50 of the charge-coupled device. The charge-coupled device includes many such cells.

Charge-coupled device 10 samples an input signal applied to contact 30 above input diffusion region 20 and stores a packet of charge in channel region 18 under sample gate electrode 36. The amount of stored charge is proportional to the voltage of the input signal. The charge packet thereafter shifts laterally from cell-to-cell through channel region 18 to floating diffusion region 28. Contact 32 above floating diffusion region 28 is suitably connected to an amplifier 46 producing an output voltage proportional to the charge in the floating diffusion region. The charge packet thereafter shifts from floating diffusion region 28 to output diffusion region 22 via the channel region 18 therebetween. Output diffusion region 22 is connected to a constant voltage source VOD that removes the charge packet from the output diffusion region. A set of phased clock signals SG, SW, P1, P2, LG and RESET control sampling of the input signal applied to contact 30 and control shifting of the resulting charge packet through channel region 18 to output diffusion region 22 in a well-known manner. The SG, SW, LG and RESET clock signals drive electrodes 36, 38, 42 and 44 respectively. The P1 and P2 clock signals drive electrode pairs 40 of alternate CCD cells 50.

Figure 2:
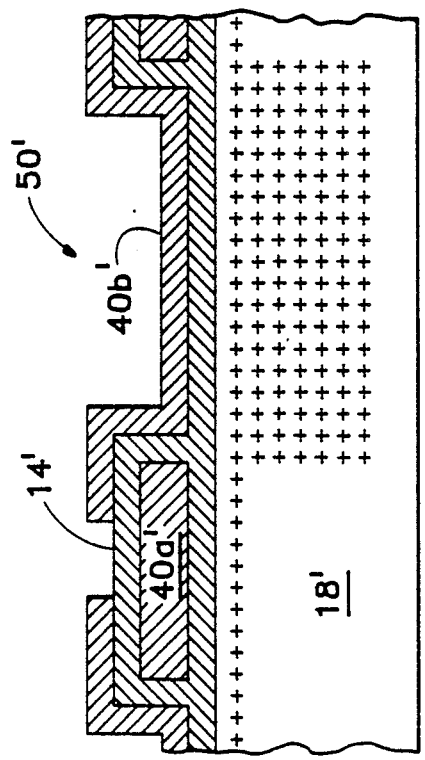
FIG. 2 is a sectional view of a prior art single cell of a two-phase, charge-coupled device.

The present invention relates to an improved CCD cell 50. To simplify understanding of the invention, a typical two-phase CCD cell of the prior art is first described. As illustrated in FIG. 2, the prior art CCD cell 50' includes a polysilicon electrode pair 40a' and 40b' insulated from a doped n-type channel region 18' in a silicon substrate by a silicon dioxide insulation layer 14'. Although not shown in FIG. 2, electrodes 40a' and 40b' receive the same clock signal P1 or P2. The "+" symbols in channel region 18' represent the relative dopant density in the channel in the direction of carrier flow. The dopant density in the channel region under each electrode 40a' and 40b' is uniform in the lateral direction, but the dopant density under electrode 40b' is much higher than the dopant density under electrode 40a'. The "stepped" channel dopant density provides a stepped built-in channel potential barrier preventing charge carriers from flowing to the left in FIG. 2.

Figure 3:
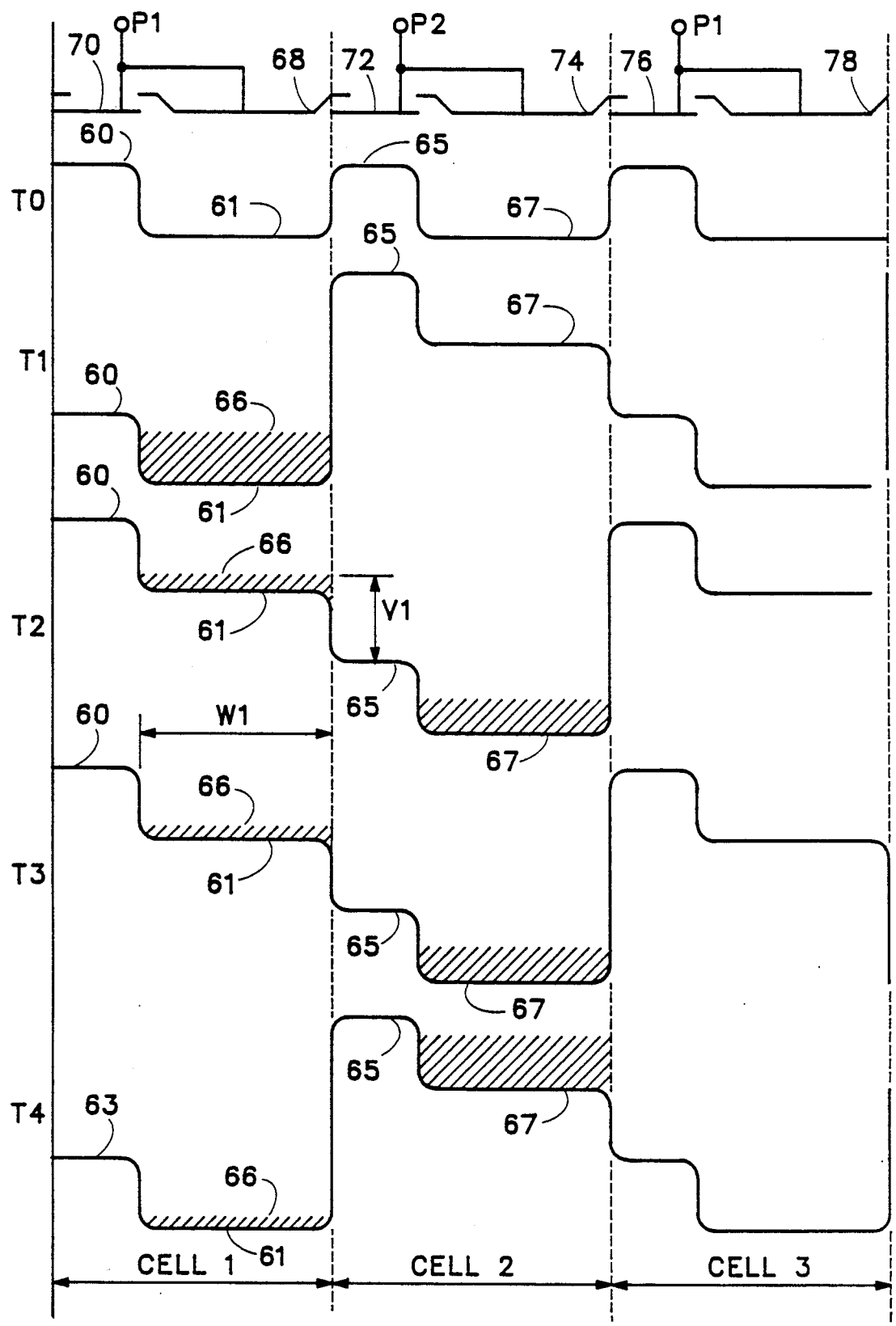
FIG. 3 is a diagram illustrating charge transfer in a two-phase, charge-coupled device including prior art CCD cells similar to the cell of FIG. 2.

FIG. 3 illustrates movement of charge carriers through adjacent prior art CCD cells of FIG. 2. The top of FIG. 3 is a simplified sectional representation of three CCD cells (cells 1-3). In a two-phase charge-coupled device, clock signals P1 and P2 are normally 180 degrees out of phase with one another and drive electrodes of adjacent cells in an alternating fashion. As illustrated in FIG. 3, clock signal P1 controls electrodes of cells 1 and 3 while clock signal P2 controls electrodes of cell 2.

FIG. 3 plots the channel potential of each cell as a function of distance along the lateral path of carrier flow in the channel at five different times T0-T4. Assume that at time T0 the clock signals are all low (the CCD is not operating in its normal mode) and the channel in each cell is at its "built-in" potential. The built-in channel potential is uniform and relatively high at an upstream end of the channel of each cell to form a potential barrier 60 or 65. The built-in channel potential is also uniform but relatively low at the downstream end of each cell to form a potential well 61 or 67. Those skilled in the art will understand FIG. 3 is somewhat idealized for illustrative purposes. Due to dopant ion diffusion and fringing effects, transitions between levels of high and low potential are slightly rounded as shown in FIG. 3.

FIG. 3 also includes plots of relative channel potential as a function of lateral distance along the channel at four different times T1–T4 during normal operation of the CCD as charge carriers 66 move from well 61 of cell 1 to well 67 of cell 2. At time T1 near the end of the P1 clock phase, clock signal P1 is driving channel potentials across cells 1 and 3 low. Cell 1 now stores the packet of charge carriers 66 in potential well 61, and potential barriers 60 and 65 prevent carriers 66 from leaving the potential well 61. Between times T1 and T2, the P1 and P2 clock signals change state. The channel potential in cells 1 and 3 rises while clock signal P2 drives down the channel potential in cell 2. Since the barrier level 65 in cell 2 falls below the well potential level 61 of cell 1, carriers 66 drift and diffuse from well 61 of cell 1, across potential barrier 65 of cell 2, and into well 67 of cell 2. By time T2, many carriers have moved from well 61 to well 65 but some remain in the well 61. At time T2, the electron flux (F), the rate of charge carrier movement across the junction between cells 1 and 2 in the lateral (x) direction, is largely dependent on the electrical field $E_x$ across the junction, on the carrier concentration $n(x)$ at the end of well 61 near the junction and on the concentration gradient $dn(x)/dx$ across the junction. In particular, $$F = -D_n\{dn(x)/dx\} + u_n n(x) E_x \qquad [1]$$

where $D_n$ is a diffusion constant for the charge carriers (electrons) and $u_n$ is the electron mobility. The first term of equation [1] represents the diffusion component of electron flux proportional to the concentration gradient across the junction between cells 1 and 2 while the second term is the drift component proportional to the product of the carrier concentration and electrical field at the junction.

At the junction between cell 1 and cell 2, the electrical field $E_x$ causing carriers to drift out of cell 1 is proportional to the potential V1 between the Fermi level in well 61 and the potential of barrier 65. As charge carriers move out of well 61, the Fermi level in the well declines, thereby decreasing potential V1. As this potential decreases, the electrical field $E_x$ driving carriers from well 61 also decreases, thereby decreasing the second term of equation [1]. In addition, as carriers move out of well 61, the concentration $n(x)$ of carriers at the junction declines, further decreasing the second term of equation [1]. The concentration gradient $dn(x)/dx$ at the junction also falls as charge moves out of well 61, thereby decreasing the first term of equation [1]. Thus, as charge carriers move out of well 61, both terms of equation [1] become progressively smaller and the charge flow rate from well 61 to cell 2 becomes progressively smaller. For example, at time T3, the concentration gradient of carriers at the junction between cells 1 and 2 is low and the first (diffusion) term of equation [1] is quite small. Since potential V1 (proportional to $E_x$) between the Fermi level of well 61 and barrier 65 is a little smaller at time T3 than at time T2, and since the concentration $n(x)$ of carriers at the junction is substantially lower at time T3 than at time T2, the second (drift) term of equation [1] is also smaller.

As the amount of charge 66 remaining in well 61 further declines, the charge flow rate from cell 1 to cell 2 becomes more a superlinear function of the "effective gate length" of the cell and less a function of the concentration of carriers or the electric field at the junction between the cells. The effective gate length of the cell at a given time is the maximum straight-line distance carriers must travel to leave the cell. In FIG. 3, the effective gate length is W1, the length of well 61. With little electric field in the well, carriers move across the well primarily by diffusion. The longer the well, the longer the time carriers require to move to the junction where the clock induced field can quickly sweep them into the next cell.

As the frequency of clock signals applied to the electrodes of a charge-coupled device increases, the time available for all charge carriers to move from a cell into its neighbor cell decreases. At high clock frequencies, a substantial number of charge carriers remain behind in well 61 at the end of a clock phase. FIG. 3, for example, shows some charge carriers 66 trapped in cell 1 at time T4 at the beginning of the next charge transfer cycle.

The "charge transfer efficiency" of a charge-coupled device is the ratio of charge transferred to a CCD cell from its neighbor cell during a clock phase to the initial charge stored by its neighbor cell at the beginning of the clock cycle. As the frequency of operation of a CCD increases, its charge transfer efficiency decreases because less time is available for charge movement during each clock period. A good charge transfer efficiency is necessary to maintain signal fidelity, particularly in charge-coupled devices having many transfer stages. The maximum operating frequency of a CCD is therefore limited by its charge transfer efficiency characteristics. In the device of FIG. 3, since the relatively long effective gate length W1 requires a relatively long time to transfer charge carriers to the next cell, the maximum operating frequency of the device is limited.

One way to speed up the charge transfer is to narrow the gate length, thus reducing the maximum distance the charge packet needs to travel. However, a gate length reduction will result in a smaller charge handling capacity and reduced channel modulation sensitivity. Short gate lengths are more difficult to fabricate due to processing limitations such as photolithography, etching, dopant side diffusion, and gate doping, etc. A smaller charge handling capacity degrades noise performance as any given amount of noise introduced by the system will represent a bigger portion of the total charge packet.

Figure 4:
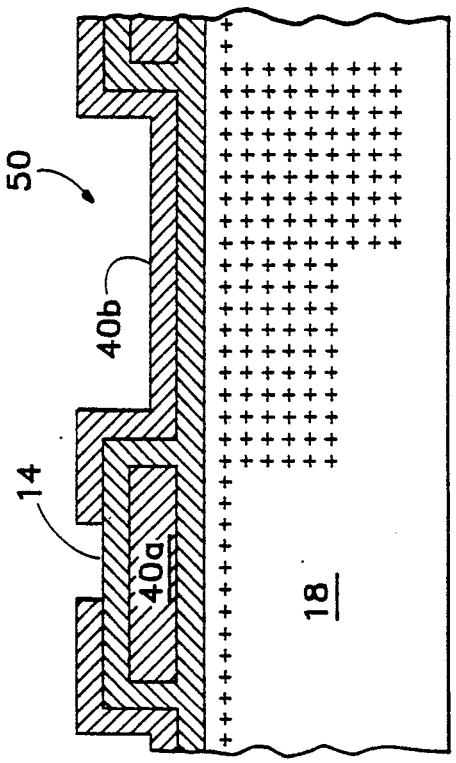
FIG. 4 is a sectional view of a single cell of a trench structured charge-coupled device in accordance with the present invention.

FIG. 4 illustrates an improved buried channel CCD cell 50 in accordance with the present invention. Like the prior art CCD cell 50' of FIG. 2, the CCD cell 50 includes a substantially uniform, lower level dopant concentration under electrode 40a forming a potential barrier and a higher level dopant concentration under the electrode 40b forming a potential well. However, unlike the prior art cell of FIG. 2, cell 50 of the present invention has a further increased dopant concentration at the downstream end of the potential well 54 to provide a potential "trench" adjacent to the next cell.

Figure 5:
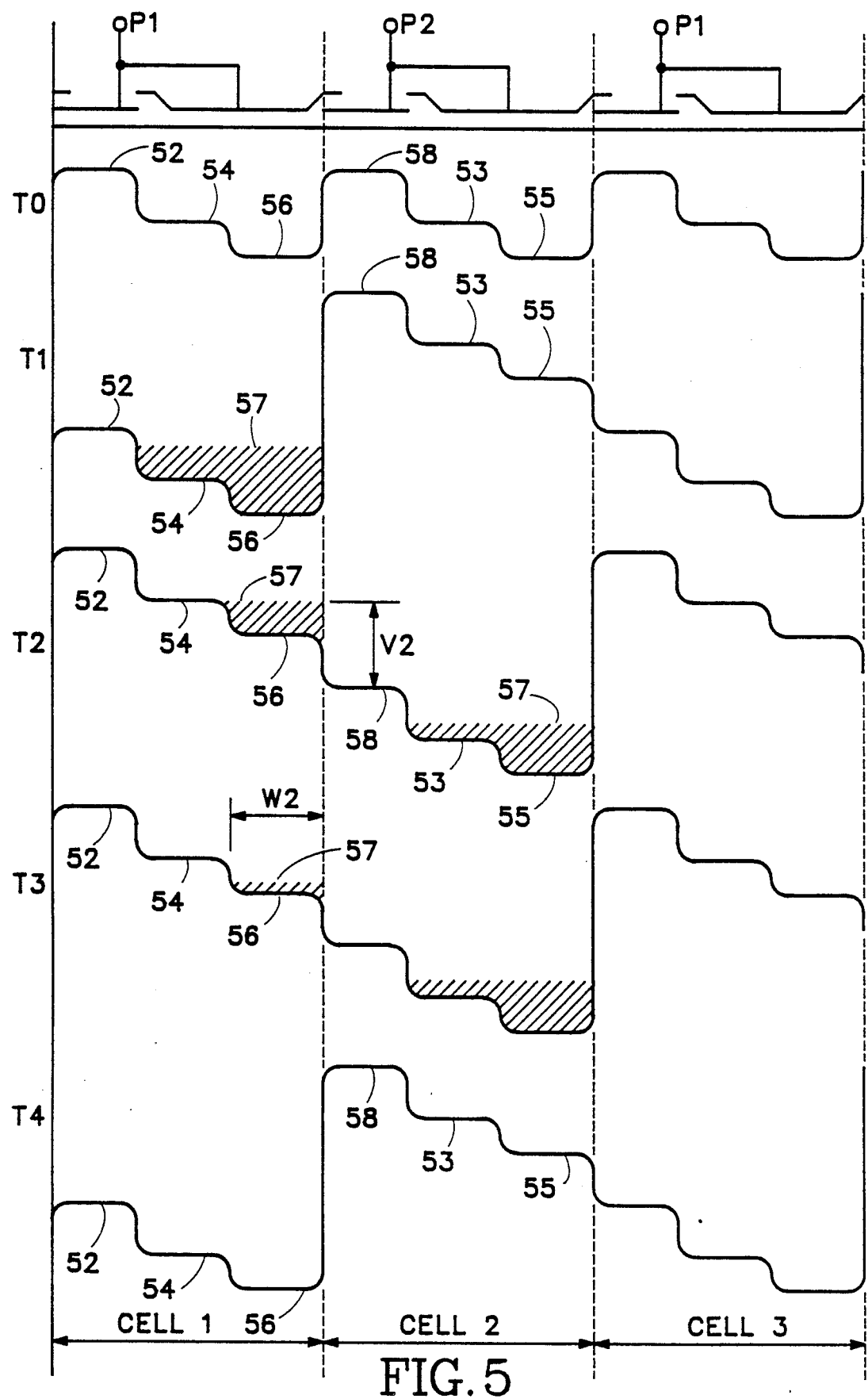
FIG. 5 is a diagram illustrating charge transfer in a two-phase, charge-coupled device formed by CCD cells similar to the cell of FIG. 4.

FIG. 5 illustrates channel potentials during charge carrier packet movement through adjacent CCD cells similar to those of FIG. 4. The built-in channel potential of each cell is illustrated by the plot at time T0 before normal CCD operation when there is no charge in the CCD and both clock signals P1 and P2 are at the same voltage level. Note the uniform built-in potential barriers 52 or 58 at the upstream end of cell channel, the well level 53 or 54 of lower potential in a middle portion of the channel of each cell, and the still lower potential trench level 55 or 56 at the downstream end of the channel in each cell.

The lateral dimensions of the potential barrier 52, well level 54 and trench level 56, and the built-in potential differences between them may vary depending on the length of the channel, the maximum amount of charge each cell is to store, and the clock signal voltage swing. Generally, for any channel length, the potential barrier 52 should be no less than about 3 microns long and the trench level 56 length should be about 30–70% of the remaining channel length. In the preferred embodiment, where the channel is about 10 microns long, the potential barrier 52 is about 3 microns long and the well level 54 and the trench level 56 are each about 3.5 microns long in the lateral direction of carrier flow. The potential difference between levels 54 and 56 is suitably 20–50% of the potential difference between levels 52 and 56. In the preferred embodiment, where 10 volt swings in clock P1 and P2 voltage levels produce about 8.5 volt swings in channel potential, the potential difference between levels 52 and 56 is about 7.0 volts and the potential difference between levels 54 and 56 is about 2.5 volts.

FIG. 5 includes four plots showing channel potential at times T1–T4 during lateral movement of a charge packet from cell 1 to cell 2 in response to changes in state of clock signals P1 and P2. At time T1, clock signal P1 has reached the end of its cycle and cell 1 stores charge carriers 57 in its potential well. The potential barrier 52 of cell 1 and the potential barrier 58 of cell 2 prevent the charge carriers 57 from leaving the potential well 54 and trench 56 of cell 1. After time T1, clock signal P2 turns on and clock signal P1 turns off. The channel potentials of cells 1 and 3 rise back to their built-in levels while clock signal P2 drives down channel potentials of cell 2. Carriers 57 drift and diffuse from cell 1 across potential barrier 58 and into the well 53 and trench 55 of cell 2. By time T2, enough carriers have moved from cell 1 to cell 2 to reduce the Fermi level of the remaining carriers slightly below the potential of the well 54 and the majority of the remaining carriers now congregate in trench 56.

During early stages of a charge transfer cycle, charge flows from cell 1 to cell 2 of FIG. 5 faster than it flows from cell 1 to cell 2 in the prior art device of FIG. 3. The junction potential V2 between the Fermi level in cell 1 and potential barrier 58 is similar to the junction potential V1 in FIG. 3 for any given amount of charge remaining in cell 1. However, trench 56 of FIG. 5 collects the carriers near the junction between cells 1 and 2 so that the carrier concentration n(x) and the concentration gradient dn(x)/dx at the junction are always higher for the device of FIG. 5 than for the device of FIG. 3. Thus, during the early stage of a charge transfer cycle, both terms of equation [1] that determine the charge transfer rate have a large value for the device of FIG. 5.

During the final stage of a charge transfer cycle when charge levels are low, diffusion of charge carriers through the storage well toward the junction becomes the dominant process limiting charge transfer rate. Since diffusion time is a superlinear function of effective gate length, a shorter effective gate length provides a faster charge transfer rate.

Referring again to FIG. 5, during the final stage of charge transfer a small amount of charge remains in trench 56 of cell 1 at time T3. Since the carriers concentrate in the trench of cell 1 of FIG. 5, the effective gate length at time T3 is the trench length W2, suitably 30–70% of the well length W1 of cell 1 of FIG. 3. Therefore, the effective gate length is shorter for the trench structured cell of FIG. 5, and charge moves out of that cell faster than it moves out of the untrenched cell of FIG. 3 during the later stages of a charge transfer cycle.

The higher junction charge concentration density and gradient of the trench structured cell increases the charge transfer rate during early stages of a charge transfer cycle. The shorter effective gate length of the trench structured cell significantly increases the charge transfer rate during the later stages of a charge transfer cycle. Therefore under high frequency operation, at the end of a charge transfer cycle substantially all the charge will move out of a trench structured cell by time T4 when clock P2 starts to fall. In contrast, a charge transfer cycle of similar duration will leave substantial charge in a prior art cell 1 at time T4 as illustrated in FIG. 3. The trench structured cell of FIG. 5 therefore exhibits a higher charge transfer efficiency during high speed operation than the prior art cell of FIG. 3.

In the CCD cell of the present invention, when the cell stores a full charge, the Fermi level of the charge is suitably about 2.0 volts less than the potential of the barrier level 52. The trench level 56 should be at least 0.5 volts higher than the barrier level 58 of the next cell when charge is flowing into the next cell. The relative lateral dimensions of the well and trench portions of the channel and the potential of the well level 54 depend on the amount of charge stored. As the trench 56 narrows, the well level 54 doping must be increased to lower its built-in potential in order to accommodate a given amount of charge. Although a narrower trench enhances charge transfer rate near the end of a clock cycle, if the trench is too narrow, the effects of shortened effective channel length do not begin until very late in the cycle and the trench has less effect on charge transfer efficiency. If the trench is too wide, the effective gate length of the device during the later stages of the transfer cycle is nearly as long as in the untrenched cell. Thus, a long trench provides little improvement charge transfer efficiency.

For a given charge storage capacity, the trench length should be such that when the Fermi level of the charge slips below the well level, about one third of the charge remains in the cell, as illustrated at time T2, FIG. 5. As mentioned hereinabove, the trench level 56 should be about 30–70% of the length of the channel not included in the barrier level 52, and the potential difference between the well and trench levels 54 and 56 should be 20–50% of the potential difference between barrier and trench levels 52 and 56. In the preferred embodiment, the well level 54 and trench level 56 are of equal length while the potential difference between the well level 54 and trench level 56 is about one third of the potential difference between barrier level 52 and trench level and 56.

Figure 6:
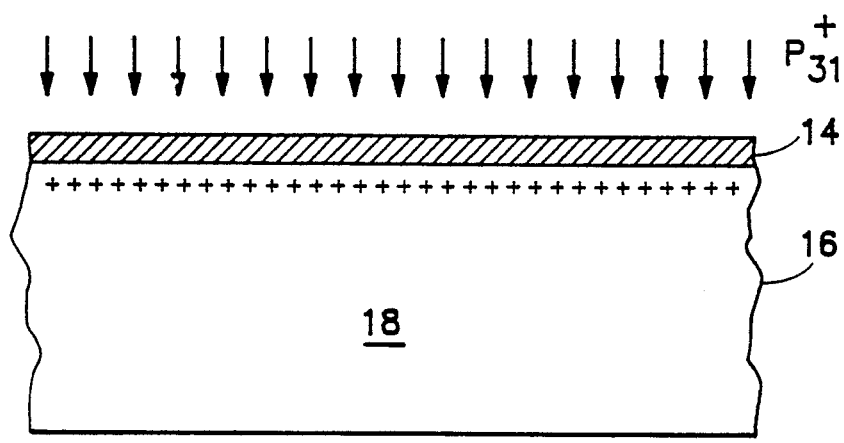
FIGS. 6-8 are sectional views illustrating various stages of fabrication of the charge-coupled device cell of FIG. 4.
Figure 7:
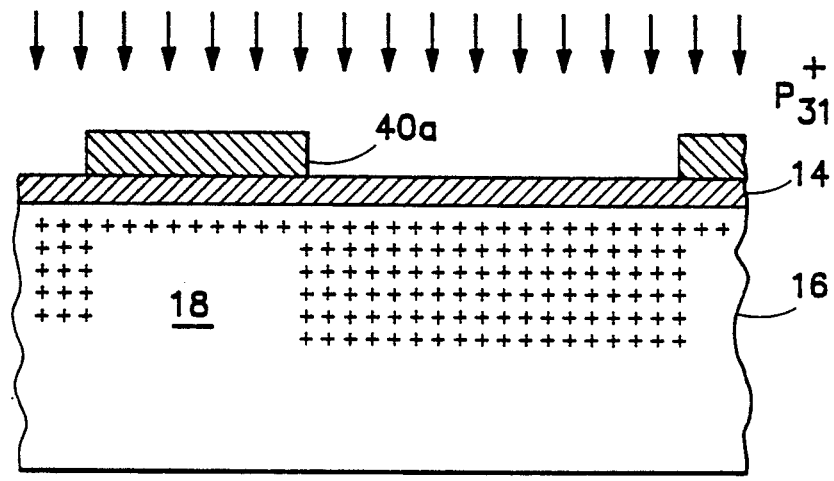
Figure 8:
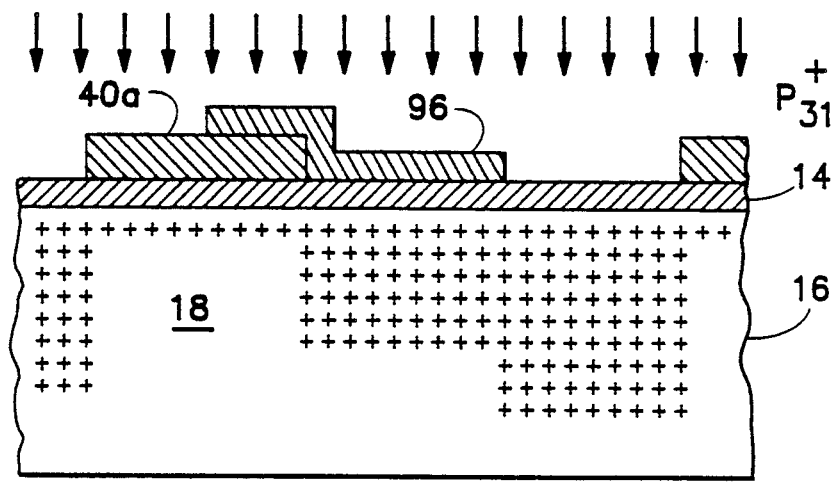

FIGS. 6–8 illustrate steps of a method for fabricating the trench structured CCD cell 50 of FIG. 4. The insulation layer 14 is grown on silicon substrate 16. The channel region 18 of the p-type silicon substrate 16 is initially doped by implanting dopant ions such as $P_{31}{}^+$ at a controlled depth in the substrate (FIG. 6). A first polysilicon cell electrode 40a is formed on insulation layer 14, and additional dopant ions are implanted into the portion of channel region 18 not under electrode 40a (FIG. 7). Electrode 40a acts as a self-aligned implantation mask. A mask 96 formed by photolithographic technique is placed above one end of electrode 40a and above an adjacent portion of insulation layer 14 (FIG. 8). $P_{31}^+$ ions are again implanted in the substrate to increase dopant concentration in the portions of the channel not under electrode 40a or mask 96, thereby to form the trench-structured portion of the channel. Mask 96 is then removed, and the insulation layer 14 is regrown on the exposed surface of the substrate as well as over the upper surface of electrode 40a. An additional electrode 40b is then formed on insulation layer 14 to provide the resulting cell as illustrated in FIG. 4.

While the potential step in the storage region of a trench structured CCD cell may be produced by step profiling the channel dopant, it also can be produced by controlling the dopant depth, the thickness of the channel region, the thickness of the insulation layer between the electrode and substrate, and the work function of the electrode. Accordingly, those skilled in the art will understand that the channel potential profile of a cell shown, for example, in FIG. 5, can be achieved by appropriately stepping the dopant depth in the channel region, the thickness of the insulation layer, or the thickness of the channel region. A trenched channel potential may also be obtained by providing a cell electrode having an appropriately stepped work function.

Thus, the charge transfer efficiency of a two-phase charge-coupled device cell is enhanced by providing a three-tiered built-in potential in the channel of each cell. Two lower potential tiers form a trenched potential well in the cell for storing charge. A higher potential tier between the trenched potential well of a cell and the potential well of its preceding neighbor cell provides a potential barrier preventing backflow of charge from well-to-well. The potential trench is located at the downstream end of the well in the direction of carrier flow. The trench increases the charge concentration gradient across the junction between neighboring cells and decreases the effective channel length of the cell during later stages of a short charge transfer cycle.

While the foregoing specification has described a preferred embodiment of the present invention, one skilled in the art may make many modifications to the preferred embodiment without departing from the invention in its broader aspects. The appended claims therefore cover all such modifications as fall within the true spirit and scope of the invention.

We claim:

1. A cell for a charge-coupled device comprising:
a semiconductor substrate;
an insulation layer formed above said substrate; and
an electrode formed above said insulation layer;
the substrate including a channel region of length coextensive with said electrode in one lateral direction for conducting charge carriers under said electrode,
the channel region comprising a barrier portion of substantial and continuous dimension in said lateral direction having a substantially homogeneous first built-in potential in said lateral direction providing minimal electric field in said lateral direction,
the channel region further comprising a well portion of continuous dimension in said lateral direction and extending across 30% to 70% of the portion of the channel region in said lateral direction not included in said barrier portion, said well portion having a substantially homogeneous built-in second potential in said lateral direction providing minimal electric field in said lateral direction, and
the channel region further comprising a trench portion of continuous dimension in said lateral direction and extending across 70% to 30% of the portion of the channel region in said lateral direction not included in said barrier portion, said trench portion having a substantially homogeneous built-in third potential in said lateral direction providing minimal electric field in said lateral direction,
said barrier, well and trench portions being respectively aligned in said lateral direction, said first and second potentials differing so as to provide a first electrical field between said barrier and well portions driving carriers in said lateral direction, said second and third potentials differing so as to provide a second electrical field between said well and trench portions driving carriers in said lateral direction, and the difference between said first and second potentials being larger than the difference between said second and third potentials.

2. A cell for a charge-coupled device comprising:
a semiconductor substrate;
an insulation layer formed above said substrate; and
an electrode formed above said insulation layer and having a stepped work function in a lateral direction;
the substrate including a channel region of length coextensive with said electrode in said lateral direction for conducting charge carriers under said electrode,
the channel region comprising a barrier portion of substantial and continuous dimension in said lateral direction having a substantially homogeneous first built-in potential in said lateral direction providing minimal electric field in said lateral direction,
the channel region further comprising a well portion of continuous dimension in said lateral direction and extending across 30% to 70% of the portion of the channel region in said lateral direction not included in said barrier portion, said well portion having a substantially homogeneous built-in second potential in said lateral direction providing minimal electric field in said lateral direction, and
the channel region further comprising a trench portion of continuous dimension in said lateral direction and extending across 70% to 30% of the portion of the channel region in said lateral direction not included in said barrier portion, said trench portion having a substantially homogeneous built-in third potential in said lateral direction providing minimal electric field in said lateral direction,
said barrier, well and trench portions being respectively aligned in said lateral direction, said first and second potentials differing so as to provide a first electrical field between said barrier and well portions driving carriers in said lateral direction, said second and third potentials differing so as to provide a second electrical field between said well and trench portions driving carriers in said lateral direction.

3. A cell for a charge-coupled device comprising:
an intrinsic p-type semiconductor substrate including a doped n-type channel region;
an insulation layer formed above said substrate; and
an electrode formed above said insulation layer;

the channel region being of length coextensive with said electrode in one lateral direction for conducting electrons in said lateral direction, the channel region comprising barrier, well and trench portions respectively aligned in said lateral direction, the well portion extending across at least 30% of a remaining portion of the channel region in said lateral direction not included in said barrier portion, the trench portion extending across at least 30% of said remaining portion of said channel region, the barrier, well and trench portions each having a substantially uniform dopant concentration in said lateral direction, the uniform dopant concentrations of said barrier, well and trench portions substantially differing one from another and the difference between the potentials of said barrier and well portions being larger than the difference between the potentials of said well and trench portions.

4. The cell in accordance with claim 3 wherein the difference between the potentials of said barrier and well portions is 20–50% of the difference between the potentials of said well and trench portions.

* * * * *

UNITED STATES PATENT AND TRADEMARK OFFICE
CERTIFICATE OF CORRECTION

PATENT NO. : 5,065,203

DATED : November 12, 1991

INVENTOR(S) : Kei-Wean Calvin Yang & John E. Taggert

It is certified that error appears in the above-identified patent and that said Letters Patent is hereby corrected as shown below:

Title Page under (*) Notice:

"Feb. 12, 1991" should be ---Feb. 12, 2008---

Signed and Sealed this

Twenty-third Day of March, 1993

*Attest:*

STEPHEN G. KUNIN

*Attesting Officer*     *Acting Commissioner of Patents and Trademarks*